(12) United States Patent
Toma et al.

(10) Patent No.: US 7,666,754 B2
(45) Date of Patent: Feb. 23, 2010

(54) METHOD AND SYSTEM FOR FORMING AN AIR GAP STRUCTURE

(75) Inventors: Dorel I. Toma, Dripping Springs, TX (US); Junjun Liu, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 110 days.

(21) Appl. No.: 11/874,461

(22) Filed: Oct. 18, 2007

(65) Prior Publication Data

US 2009/0130863 A1     May 21, 2009

(51) Int. Cl.
    *H01L 21/76*     (2006.01)
(52) U.S. Cl. .................. 438/422; 438/99; 438/319; 438/421; 257/E21.573; 257/E21.581
(58) Field of Classification Search ................. 438/318, 438/319, 411, 412, 422, 960
    See application file for complete search history.

(56) References Cited

U.S. PATENT DOCUMENTS

| 6,380,106 | B1 | 4/2002 | Lim et al. | |
|---|---|---|---|---|
| 7,098,476 | B2 | 8/2006 | Babich et al. | |
| 7,256,127 | B2 | 8/2007 | Gallagher et al. | |
| 2004/0137728 | A1* | 7/2004 | Gallagher et al. | 438/689 |
| 2005/0221600 | A1 | 10/2005 | Daamen et al. | |
| 2006/0025549 | A1 | 2/2006 | Kim | |
| 2006/0069171 | A1 | 3/2006 | Prokopowicz et al. | |

OTHER PUBLICATIONS

International Searching Authority, International Search Report and Written Opinion, International Application No. PCT/US08/79877, Mailed Dec. 22, 2008, 8 pages.

* cited by examiner

*Primary Examiner*—Savitri Mulpuri
*Assistant Examiner*—Cheung Lee

(57) ABSTRACT

A method for forming an air gap structure on a substrate is described. The method comprises forming a sacrificial layer on a substrate, wherein the sacrificial layer comprises a decomposable material that thermally decomposes at a thermal decomposition temperature above approximately 350 degrees C. Thereafter, a cap layer is formed on the sacrificial layer at a substrate temperature less than the thermal decomposition temperature of the sacrificial layer. The sacrificial layer is decomposed by performing a first exposure of the substrate to ultraviolet (UV) radiation and heating the substrate to a first temperature less than the thermal decomposition temperature of the sacrificial layer, and the decomposed sacrificial layer is removed through the cap layer. The cap layer is cured to cross-link the cap layer by performing a second exposure of the substrate to UV radiation and heating the substrate to a second temperature greater than the first temperature.

17 Claims, 10 Drawing Sheets

METHOD AND SYSTEM FOR FORMING AN AIR GAP STRUCTURE

CROSS-REFERENCE TO RELATED APPLICATIONS

This application is related to pending U.S. patent application Ser. No. 11/269,581, entitled "MULTI-STEP SYSTEM AND METHOD FOR CURING A DIELECTRIC FILM", filed on Nov. 9, 2005; pending U.S. patent application Ser. No. 11/517,358, entitled "THERMAL PROCESSING SYSTEM FOR CURING DIELECTRIC FILMS", filed on Sep. 8, 2006; and co-pending U.S. patent application Ser. No. 11/873,977, entitled "METHOD FOR AIR GAP FORMATION USING UV-DECOMPOSABLE MATERIALS" filed on even date herewith. The entire contents of these applications are herein incorporated by reference in their entirety.

BACKGROUND OF THE INVENTION

1. Field of the Invention

The invention relates to a method and system for forming an air gap structure on a substrate and, more particularly, to a method and system for decomposing and removing a sacrificial layer through a cap layer using a first ultraviolet (UV) radiation process, and curing the cap layer using a second UV radiation process.

2. Description of Related Art

As is known to those in the semiconductor art, interconnect delay is a major limiting factor in the drive to improve the speed and performance of integrated circuits (IC). One way to minimize interconnect delay is to reduce inter-connect capacitance by using low dielectric constant (low-k) materials as the insulating dielectric for metal wires in the IC devices. Thus, in recent years, low-k materials have been developed to replace relatively high dielectric constant insulating materials, such as silicon dioxide. In particular, low-k films are being utilized for inter-level and intra-level dielectric layers between metal wires in semiconductor devices.

Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

Furthermore, in yet another attempt to reduce the dielectric constant of insulating materials, air gap structures are contemplated. Air gap structures are formed by depositing a sacrificial material on a substrate and then depositing a bridging material over the sacrificial material. Thereafter, at a later point in the device manufacturing process, the sacrificial material is decomposed and removed in order to leave a gap or void in its absence. Conventionally, the sacrificial material is removed using a chemical or thermal process.

However, despite the promise of superior electrical performance by this approach, the mechanical stability is a primary concern. In particular, when the bridging materials, which may include porous low-k materials, are formed, these materials have been observed to collapse during decomposition and subsequent process steps. Furthermore, the selection of a sacrificial material, the selection of a bridging material, and the processes for preparing, forming and integrating these materials pose numerous challenges for the successful implementation of an air gap structure in an IC device.

SUMMARY OF THE INVENTION

The invention relates to a method and system for forming an air gap structure on a substrate. More particularly, the invention relates to a method and system for decomposing and removing a sacrificial layer through a cap layer using a first ultraviolet (UV) radiation process, and curing the cap layer using a second UV radiation process.

According to an embodiment, a method for forming an air gap structure on a substrate is described. The method comprises forming a sacrificial layer on a substrate, wherein the sacrificial layer comprises a decomposable material that thermally decomposes at a thermal decomposition temperature above approximately 350 degrees C. Thereafter, a cap layer is formed on the sacrificial layer at a substrate temperature less than the thermal decomposition temperature of the sacrificial layer. The sacrificial layer is decomposed by performing a first exposure of the substrate to ultraviolet (UV) radiation and heating the substrate to a first temperature less than the thermal decomposition temperature of the sacrificial layer, and the decomposed sacrificial layer is removed through the cap layer. The cap layer is cured to cross-link the cap layer by performing a second exposure of the substrate to UV radiation and heating the substrate to a second temperature greater than the first temperature.

According to another embodiment, a processing system for preparing an air gap structure on a substrate is described, comprising: a processing chamber configured to provide a vacuum environment for a substrate; a substrate holder coupled to the processing chamber, and configured to support the substrate; a first ultraviolet (UV) radiation source configured to expose the substrate to a first spectrum of UV radiation; a second ultraviolet (UV) radiation source configured to expose the substrate to a second spectrum of UV radiation; and a heating device configured to elevate the temperature of the substrate.

DETAILED DESCRIPTION OF EXEMPLARY EMBODIMENTS

In the following description, in order to facilitate a thorough understanding of the invention and for purposes of explanation and not limitation, specific details are set forth, such as a particular process and descriptions of various systems and components within which such a process may be performed. However, it should be understood that the invention may be practiced in other embodiments that depart from these specific details.

As described above, air gap structures are contemplated for further reducing interconnect capacitance and, in turn, reducing interconnect delay and improving the speed and performance of integrated circuits (IC). Therein, bridging material is formed over sacrificial material, and the sacrificial material is decomposed and removed in order to leave a gap or void in its absence. Also, as described above, when the bridging materials, which overlie the sacrificial material, are formed, these materials have been observed to collapse during decomposition of the sacrificial material and subsequent process steps. Therefore, a method and system is described for forming an air gap structure on a substrate that has greater mechanical strength.

Figure 1:
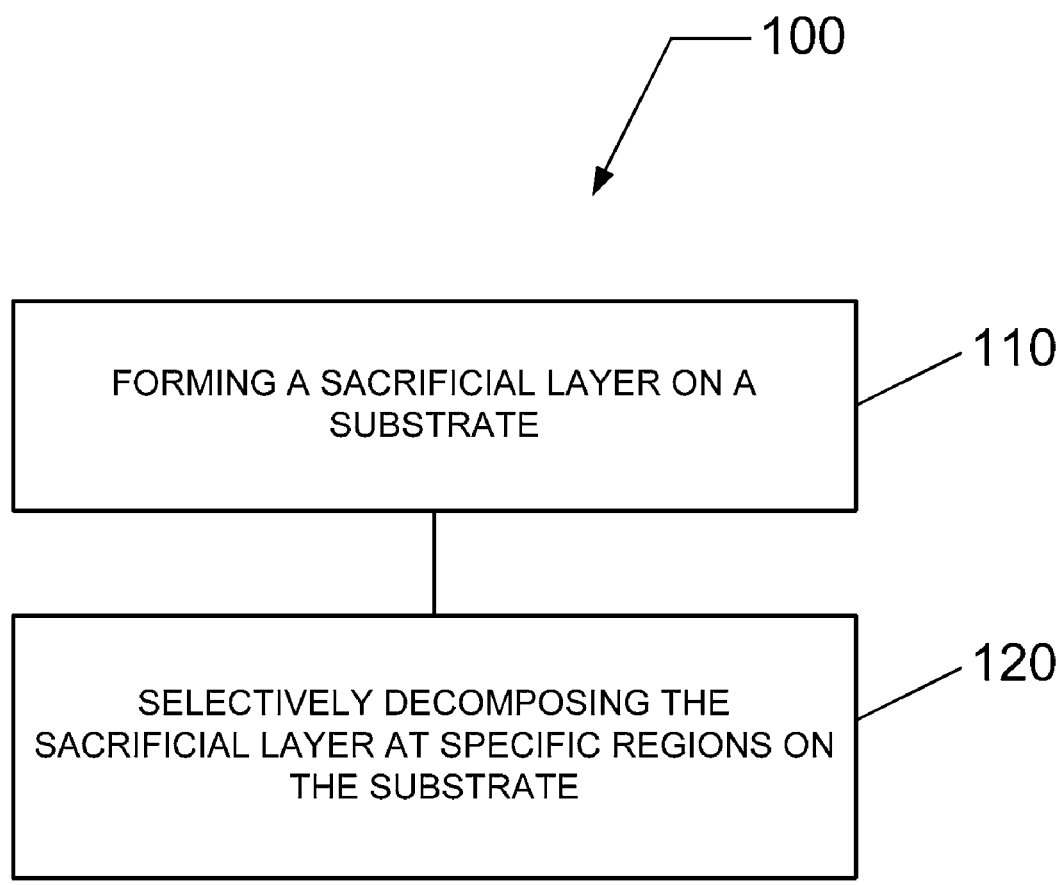
FIG. 1 is a flow chart of a method of removing a sacrificial material on a substrate.

Referring to FIG. 1, a method of selectively removing a sacrificial material on a substrate is described. The method comprises a flow chart 100 beginning in 110 with forming a sacrificial layer on a substrate. The sacrificial layer may be formed using a vapor deposition process, such as an initiated chemical vapor deposition (iCVD) process as described in greater detail below. Thereafter, in 120, the sacrificial layer is selectively decomposed at a temperature less than the temperature required to thermally decompose the sacrificial layer, wherein the selective decomposition is performed by selectively exposing the sacrificial layer to UV radiation. The temperature required to thermally decompose the sacrificial layer can vary depending upon the chemical composition of the sacrificial layer, and the dimensions of the sacrificial layer. For example, the temperature required to thermally decompose the sacrificial layer can be different for a patterned film versus a blanket film.

By selectively decomposing the sacrificial material, the sacrificial material may be retained in regions on the substrate where greater mechanical strength is desired (e.g., wide spacing of metal lines in IC devices), and the sacrificial material may be removed in regions on the substrate where less mechanical strength is desired (e.g., close spacing of metal lines in IC devices). In regions on the substrate where greater mechanical strength is desired (e.g., wide spacing of metal lines in IC devices), the demand for lower dielectric constant (to lower the line capacitance) is less (due to, for example, the wider spacing), whereas in regions on the substrate where less mechanical strength is desired (e.g., close spacing of metal lines in IC devices), the demand for lower dielectric constant (to lower the interconnect line capacitance) is greater (due to, for example, the closer spacing). Alternatively, the sacrificial layer may not be selectively decomposed, and rather the sacrificial layer may be non-selectively decomposed, i.e., substantially the entire sacrificial layer is subjected to a decomposition process by exposing the sacrificial layer to UV radiation at a temperature less than the temperature required to thermally decompose the sacrificial layer.

For example, the method may comprise forming the sacrificial layer on the substrate, wherein the sacrificial layer comprises a decomposable material that thermally decomposes at a thermal decomposition temperature above approximately 325 degrees C. Once the sacrificial material is formed, a cap layer is formed over the sacrificial material to serve as the bridging material. Thereafter, the sacrificial material is selectively decomposed at specific regions on the substrate or non-selectively decomposed by selectively or non-selectively exposing the sacrificial layer to ultraviolet (UV) radiation and heating the substrate to a UV-assisted decomposition temperature less than the thermal decomposition temperature of the sacrificial layer. The method may further comprise selectively exposing the sacrificial layer at the specific regions on the substrate to infrared (IR) radiation, or non-selectively exposing the sacrificial layer to infrared (IR) radiation.

The inventors have recognized that a UV-assisted decomposition process is more efficient in energy transfer, as compared to purely thermal decomposition processes, and the higher energy levels found in the form of energetic photons can facilitate the decomposition of a sacrificial material at a temperature less than its thermal decomposition temperature. Since the temperature of the sacrificial layer does not exceed its thermal decomposition temperature, the sacrificial layer may be selectively decomposed by selectively assisting the decomposition process at specific regions through selective exposure to UV radiation or non-selectively decomposed by non-selectively assisting the decomposition process through non-selective exposure to UV radiation.

Figure 2:
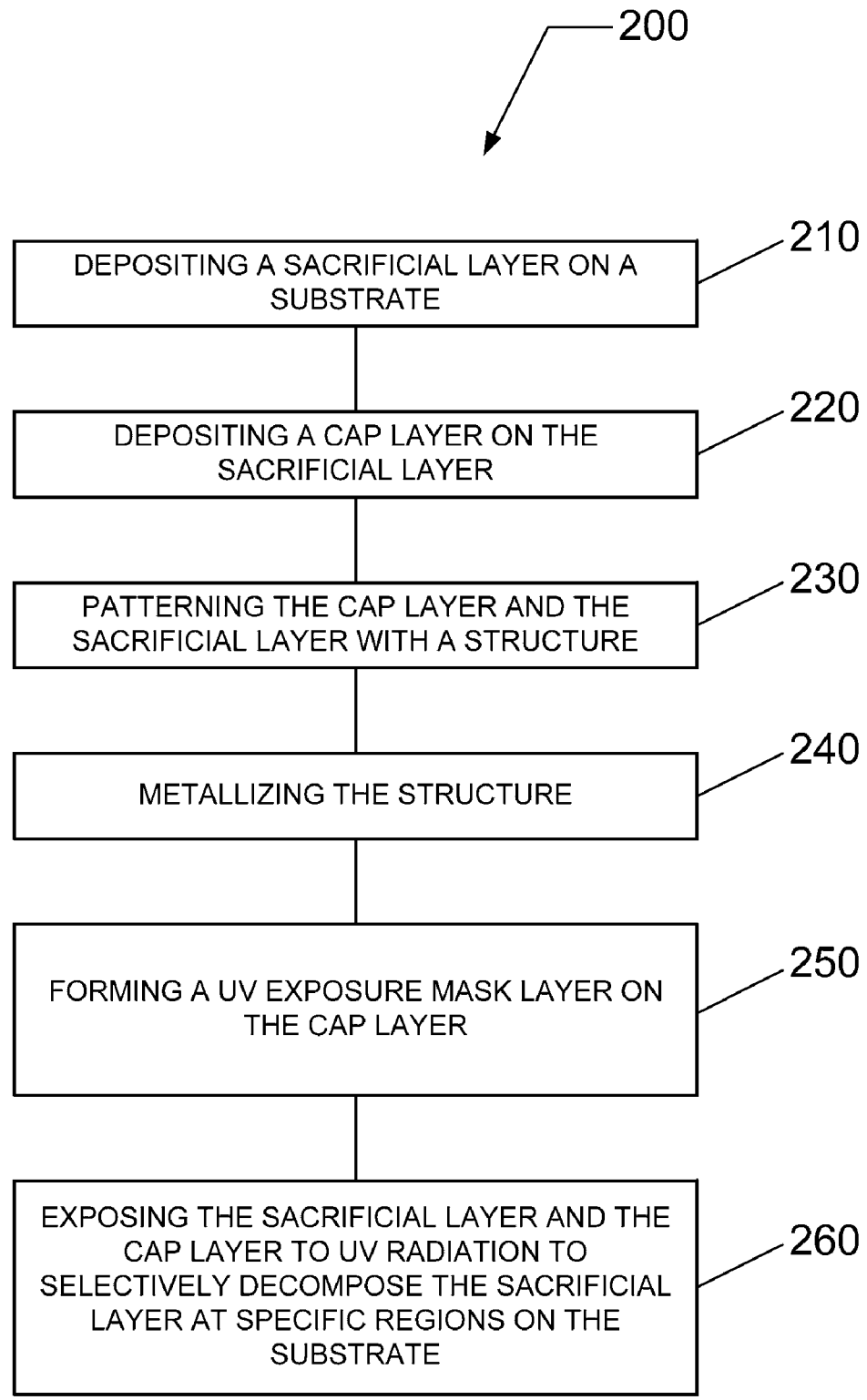
FIG. 2 is a flow chart of a method of removing a sacrificial material on a substrate.

Referring now to FIG. 2, a method of selectively removing a sacrificial material on a substrate is described. Although the method is described for selectively removing a sacrificial material on a substrate, the method may be utilized for non-selectively removing a sacrificial layer on a substrate. The method comprises a flow chart 200 beginning in 210 with depositing a sacrificial layer on a substrate. The sacrificial layer may be formed using a vapor deposition process, such as an initiated chemical vapor deposition (iCVD) process as described in greater detail below.

In 220, a cap layer is deposited on the sacrificial layer, wherein the cap layer comprises a porous material. The cap layer may be formed using a vapor deposition process, such as a chemical vapor deposition (CVD) process as described in greater detail below.

Thereafter, in 230, the cap layer and the sacrificial layer are patterned with a structure comprising a via structure, a trench structure, or a trench-via structure, or a combination thereof. The patterning process may include a wet developing process, a dry developing process, a wet etch process, or a dry etch process, or any combination of two or more thereof. For example, such processes would be understood by one skilled in the art of preparing and using a lithographic mask, with or without one or more soft mask layers or hard mask layers, to etch a pattern into one or more dielectric layers to form the structure.

In 240, the structure is metallized, wherein at least a portion of the cap layer is exposed. The metallization process may include conformally depositing a barrier layer on the substrate, filling the structure with metal, performing a pre-planarization anneal process, and planarizing the metallized structure to the cap layer in order to expose the cap layer. For example, the metallization process may include a damascene process, or a dual damascene process.

In 250, once the metallized structure is formed, a UV exposure mask layer is formed on the cap layer, wherein the UV exposure mask layer comprises an exposure pattern for decomposing the sacrificial layer. For example, the UV exposure mask layer may comprise a non-critical lithographic mask prepared using conventional lithographic procedures. If non-selective removal of the sacrificial layer is desired, then the UV exposure mask may not be necessary.

In 260, the sacrificial layer and the cap layer are exposed to UV radiation in order to selectively decompose the sacrificial layer according to the exposure pattern at a temperature less than the temperature required to thermally decompose the sacrificial layer.

Figure 3:
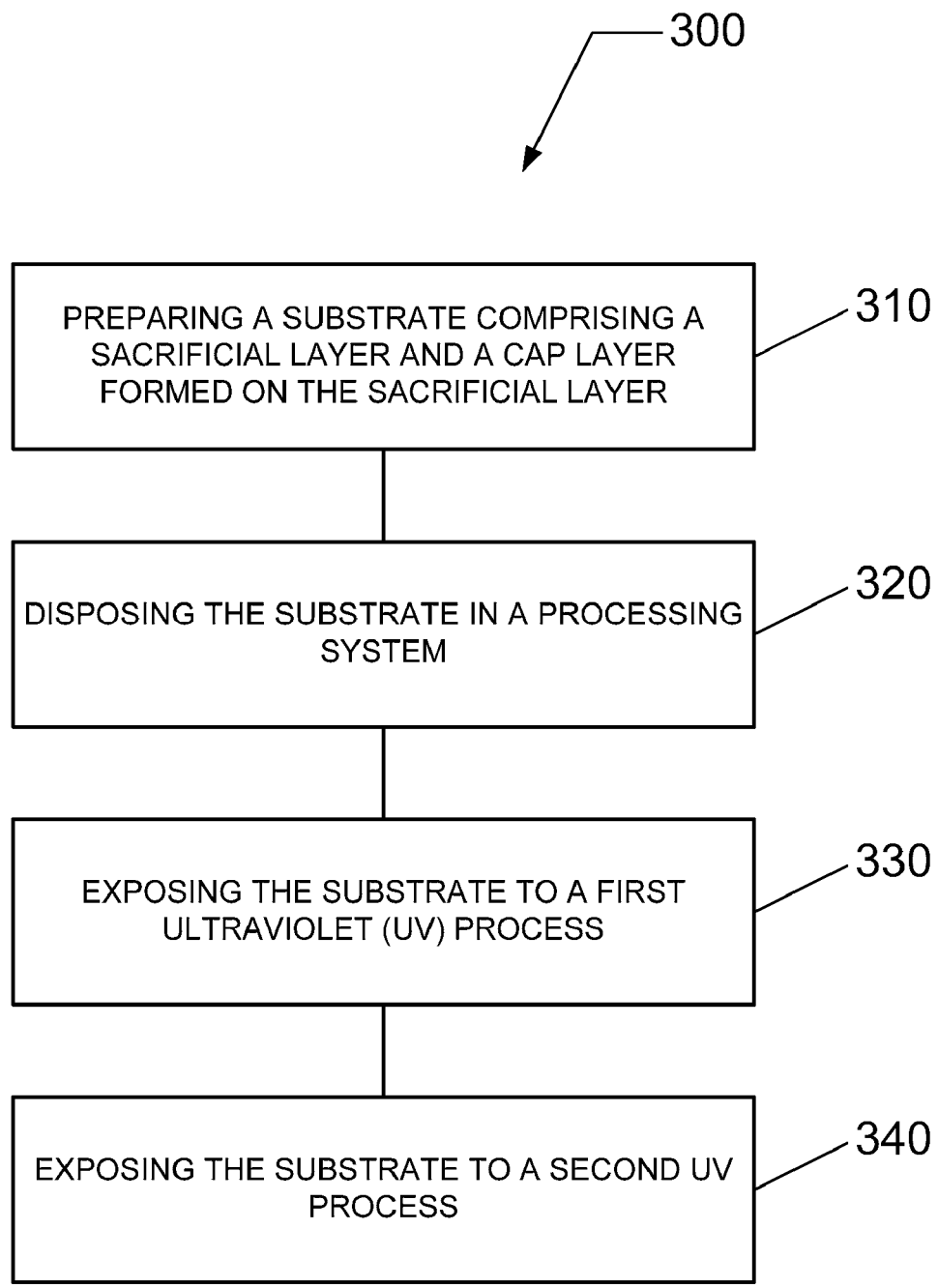
FIG. 3 is a flow chart of a method of forming an air gap structure on a substrate according to an embodiment.

Referring now to FIG. 3, a method for forming an air gap structure on a substrate is described according to another embodiment. The method comprises a flow chart 300 beginning in 310 with preparing a substrate comprising a sacrificial layer and a cap layer formed on the sacrificial layer.

Thereafter, in 320, the substrate is disposed in a processing system. The processing system may be configured to support the substrate while providing a contaminant-free, low pressure (e.g., sub-atmospheric) environment. Furthermore, the processing system may be configured to irradiate the substrate with ultraviolet radiation and optionally infrared (IR) radiation. Moreover, the processing system may be configured to heat the substrate and control the temperature of the substrate.

In 330, the sacrificial material is exposed to a first UV radiation process in order to decompose the sacrificial material and cause the removal of the sacrificial material through the cap layer. The UV radiation for the first exposure process is selected in order to decompose the sacrificial material and partially cure the cap layer. The inventors have observed that partial curing of the cap layer during the first UV radiation exposure is acceptable, as long as that cross-linking in the cap layer is reduced or minimized. Excessive cross-linking of the cap layer during the first UV exposure can cause difficulty in removing the decomposed sacrificial material through the cap layer.

In 340, the cap layer is exposed to a second UV radiation process in order to substantially remove decomposed sacrificial material trapped in the cap layer and substantially complete the curing of the cap layer. The curing of the cap layer during the second UV exposure process may serve to mechanically strengthen the cap layer.

When preparing an air gap structure, the cap layer, which bridges the air gap or void, may comprise a low-k dielectric material or an ultra-low-k (ULK) dielectric material. Furthermore, the cap layer may comprise a porous ULK dielectric material.

The cap layer may have a dielectric constant value (before drying and/or curing, or after drying and/or curing, or both) equal to or less than the dielectric constant of $SiO_2$, which is approximately 4 (e.g., the dielectric constant for thermal silicon dioxide can range from 3.8 to 3.9). In various embodiments of the invention, the cap layer may have a dielectric constant (before drying and/or curing, or after drying and/or curing, or both) of less than 3.0, a dielectric constant of less than 2.5, or a dielectric constant ranging from 1.6 to 2.7.

Low-k materials are less robust than more traditional silicon dioxide, and the mechanical strength deteriorates further with the introduction of porosity. The porous low-k films can easily be damaged during plasma processing, thereby making desirable a mechanical strengthening process (or curing process). It has been understood that enhancement of the material strength of porous low-k dielectrics is essential for their successful integration. Aimed at mechanical strengthening, curing techniques are being explored to make porous low-k films more robust and suitable for integration.

The curing of a low-k film includes a process whereby a thin film deposited for example using spin-on or vapor deposition (such as chemical vapor deposition CVD) techniques, is treated in order to cause cross-linking within the film. During the curing process, free radical polymerization is understood to be the primary route for cross-linking. As polymer chains cross-link, mechanical properties, such as the Young's modulus, the film hardness, the fracture toughness and the interfacial adhesion, are improved, thereby improving the fabrication robustness of the low-k film (i.e., the cap layer).

Figure 4A:
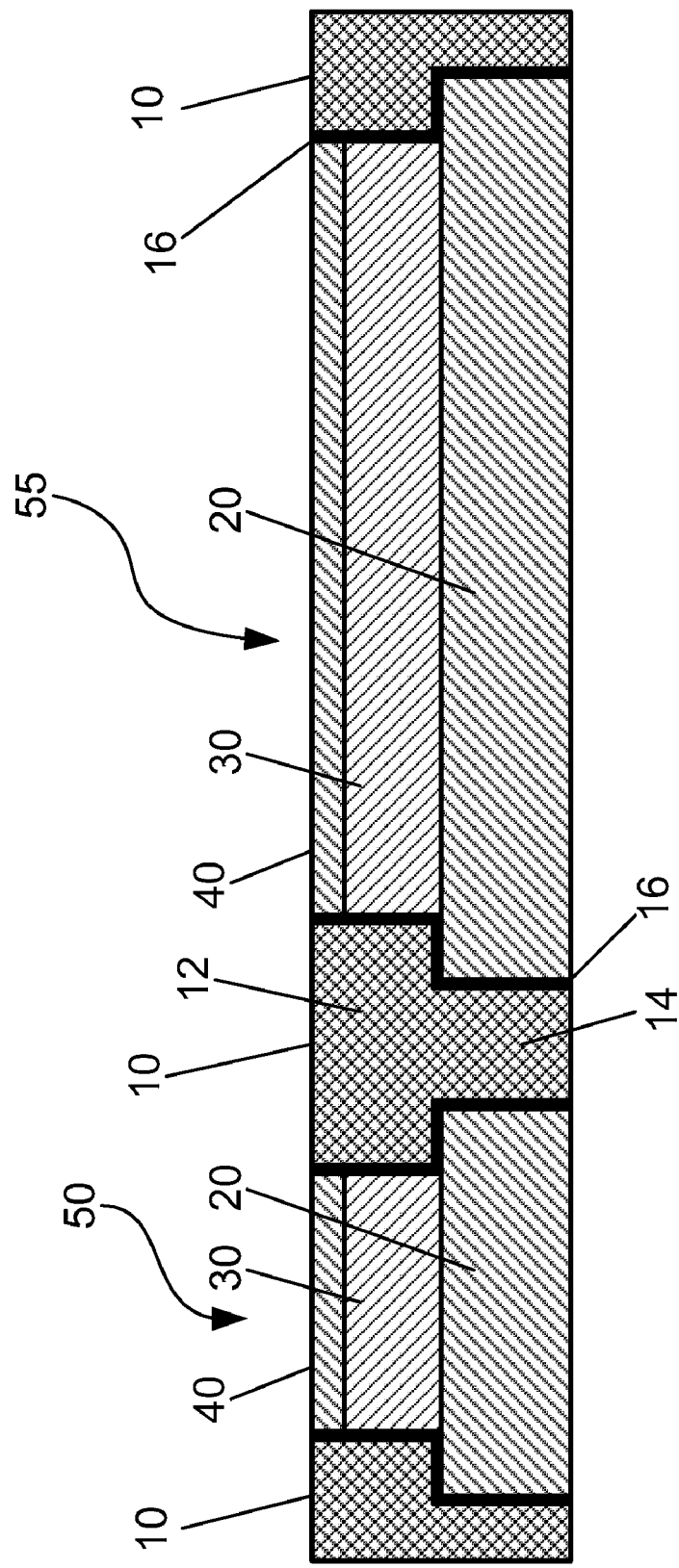
FIGS. 4A through 4E illustrate a method of forming an air gap structure on a substrate according to an embodiment.

Referring now to FIGS. 4A through 4E, a method of removing a sacrificial material and a method of forming an air gap structure are illustrated. In FIG. 4A, an exploded view of a circuit level on a portion of a substrate is depicted. The substrate comprises metal interconnects 10 having a metal line 12 and a metal via 14 that connects metal line 12 with electrical circuitry underlying the depicted circuit level. Each metal via 14 is electrically insulated from the next metal via 14 by via level dielectric layer 20, and each metal line 12 is electrically insulated from the next metal line 12 by line level dielectric comprising a sacrificial layer 30 and a cap layer 40. Once the sacrificial layer 30 is removed, an air gap structure having the cap layer 40 as the bridging material remains as the line level dielectric for portions of the substrate. Further, a liner 16 comprising a barrier material may be deposited between the insulating dielectrics and the metal lines 12 and metal vias 14.

Additionally, as shown in FIG. 4A, the spacing between metal lines 12 may vary across the substrate. For example, the spacing between metal lines 12 can be (relatively) narrow in a first region 50, while the spacing can be (relatively) wide in a second region 55. In regions where the spacing is relatively narrow, the necessity for a lower dielectric constant of the insulating material may be greater in order to compensate for the closer spacing and, therefore, an air gap structure may be formed. In regions where the spacing is relatively wide, the necessity for a lower dielectric constant may be less and, hence, the sacrificial material may be retained in the structure in order to preserve mechanical strength. Alternatively, the spacing between metal lines 12 may not vary across the substrate.

The substrate, to be treated, may be a semiconductor, a metallic conductor, or any other substrate to which the air gap structure is to be formed upon. The cap layer 40 comprises a dielectric material that may have a dielectric constant value equal to or less than the dielectric constant of $SiO_2$, which is approximately 4 (e.g., the dielectric constant for thermal silicon dioxide can range from 3.8 to 3.9). In various embodiments of the invention, the cap layer 40 may have a dielectric constant of less than 3.0, a dielectric constant of less than 2.5, or a dielectric constant ranging from 1.6 to 2.7.

The cap layer 40 may be described as a low dielectric constant (low-k) film or an ultra low-k film. The cap layer 40 may include a porous dielectric film, or it may include a non-porous dielectric film. However, in the latter, the cap layer 40 should allow the removal of the sacrificial layer 30 during it's decomposition. For instance, if the cap layer 40 includes a non-porous material, then one or more openings may be formed to permit the passage of the decomposed sacrificial material. As an example, the cap layer 40 may include a dual phase porous low-k film. The dielectric constant of the cap layer 40 may have a higher dielectric constant prior to porogen burn-out than following porogen burn-out.

The cap layer 40 can be formed using chemical vapor deposition (CVD) techniques, or spin-on dielectric (SOD) techniques such as those offered in the CLEAN TRACK ACT 8 SOD (a spin coating machine for semiconductor processing) and CLEAN TRACK ACT 12 SOD (a spin coating machine for semiconductor processing) coating systems commercially available from Tokyo Electron Limited (TEL). The CLEAN TRACK ACT 8 (200 mm) and CLEAN TRACK ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate as known to those skilled in the art of both spin-on dielectric technology and CVD dielectric technology are suitable for the invention.

As described above, the cap layer 40 may be characterized as a low dielectric constant (or low-k) dielectric film. The cap layer 40 may include at least one of an organic, inorganic, and inorganic-organic hybrid material. Additionally, the cap layer 40 may be porous or non-porous. For example, the cap layer 40 may include an inorganic, silicate-based material, such as oxidized organosilane (or organo siloxane), deposited using CVD techniques. Examples of such films include BLACK DIAMOND CVD organosilicate glass (OSG) films (insulating material for semiconductor processing) commercially available from Applied Materials, Inc., or CORAL CVD films (insulating material for semiconductor processing) commercially available from Novellus Systems. Additionally, for example, the cap layer 40 can include single-phase materials, such as a silicon oxide-based matrix having terminal organic side groups that inhibit cross-linking during a curing process to create small voids (or pores). Additionally, for example, the cap layer 40 can include dual-phase materials, such as a silicon oxide-based matrix having inclusions of organic material (e.g., a porogen) that is decomposed and evaporated during a curing process. Alternatively, the cap layer 40 may include an inorganic, silicate-based material, such as hydrogen silsesquioxane (HSQ) or methyl silsesquioxane (MSQ), deposited using SOD techniques. Examples of such films include FOx ® HSQ (insulating material for semiconductor processing) commercially available from Dow Corning Corporation, XLK porous HSQ (insulating material for semiconductor processing) commercially available from Dow Coming Corporation, and JSR LKD-5109 (insulating material for semiconductor processing) commercially available from JSR Microelectronics. Still alternatively, the cap layer 40 can include an organic material deposited using SOD techniques. Examples of such films include SILK-I SILK-J SILK-H SILK-D, porous SILK-T, porous SILK-Y, and porous SILK-Z semiconductor dielectric resins (insulating materials for semiconductor processing) commercially available from Dow Chemical Company, and FLARE, and NANOGLASS (insulating materials for semiconductor processing) commercially available from Honeywell International, Inc.

The sacrificial layer 30 comprises a decomposable polymer. The polymer may comprise cross-linked polymers. Additionally, the sacrificial layer 30 may comprise a thermally degradable polymer having thermal properties that may be tunable based upon selection of it's chemical structure.

The decomposable polymer can be formed using a polymerization process that utilizes one or more monomers and optionally one or more initiators, wherein the one or more initiators may cause the dissociation or fragmentation of the one or more monomers, thus forming reactive monomers. Additionally, one or more cross-linking agents may be utilized to facilitate or assist the polymerization process on the substrate. For example, the polymerization process may include initiated chemical vapor deposition (iCVD). Additional details on an iCVD process are described in pending U.S. Patent Application Publication No. US 2007/0032620 A1, entitled "Chemical Vapor Deposition of Hydrogel Films". Further details on iCVD hardware are described in pending U.S. patent application Ser. No. 11/693,067, entitled "Vapor Deposition System and Method of Operating".

The one or more monomers may comprise a methacrylate monomer. A monomer can have various side groups, including phenyls, ethers, silyl/siloxyl groups, amides, and unsaturated and saturated hydrocarbon groups.

The one or more cross-linking agents may comprise difunctional acrylate cross-linkers or methacrylate cross-linkers.

Figure 6:
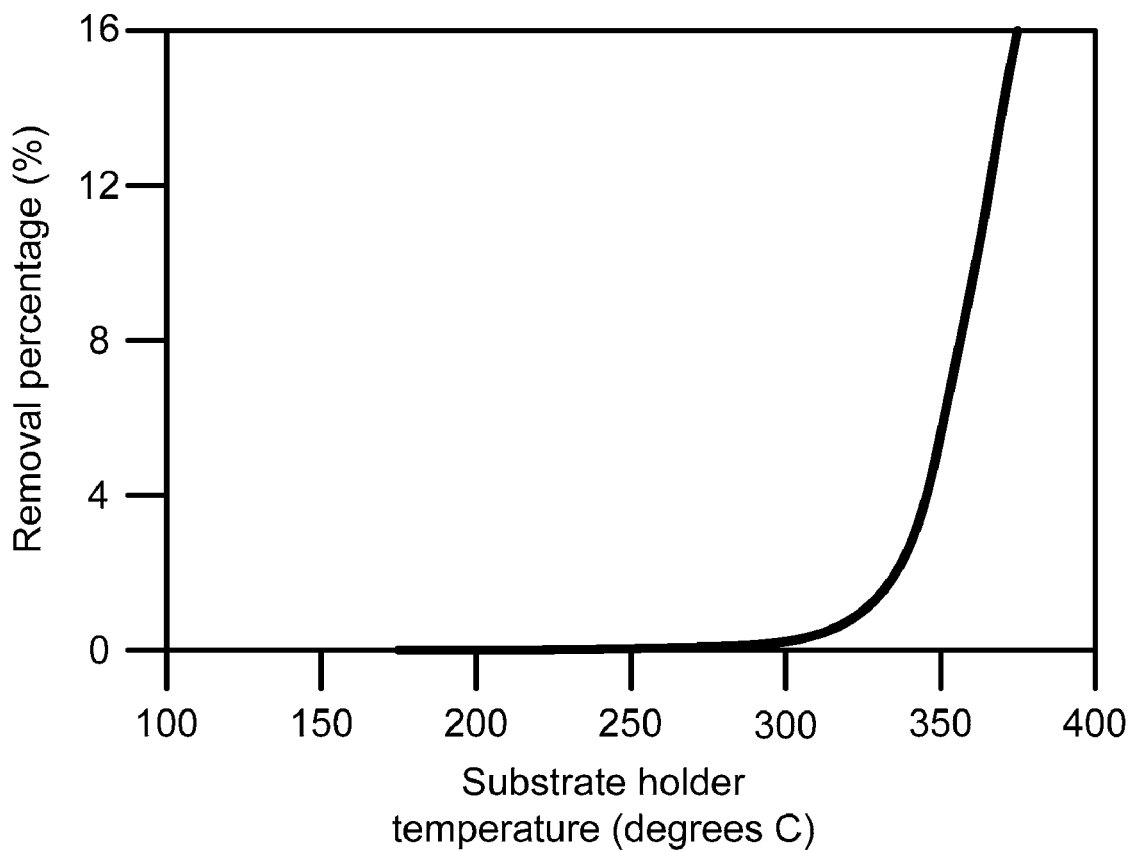
FIG. 6 presents exemplary data for decomposing a sacrificial material.

According to one example, the sacrificial layer 30 may comprise P(npMA-co-EGDA), wherein P(npMA) (poly (neopentyl methacrylate)) represents the monomer and EGDA (ethylene glycol diacrylate) represents the cross-linking agent. Referring to FIG. 6, exemplary data is provided for a sacrificial layer comprising P(npMA-co-EGDA). The removal percentage (%) of the sacrificial layer is illustrated as a function of the temperature (degrees C.) of the substrate holder upon which the substrate having the sacrificial layer rests, wherein no UV radiation is utilized to assist the decomposition process. From inspection of FIG. 6, decomposition of the sacrificial layer initiates at approximately 300 degrees C., and only a marginal amount of the sacrificial layer (about 16%) is removed at 375 degrees C.

Now referring to Table 1, additional exemplary data is provided for P(npMA-co-EGDA), wherein UV radiation is utilized to assist the decomposition process. As shown in Table 1, the thickness change of a sacrificial layer (%) is provided as a function of the wavelength of UV radiation in nanometers (nm) and the substrate holder temperature (degrees C.). From inspection of the data, the absence of UV radiation at a substrate holder temperature of 300 degrees C. produces a negligible change in thickness of the sacrificial layer (i.e., negligible decomposition). However, the irradiation of the sacrificial layer with UV radiation, coupled with elevation of the substrate holder temperature to 300° C., causes a substantial increase in the thickness change of the sacrificial layer. In particular, at shorter UV wavelengths (i.e., more energetic photons), the decomposition process is more effective at the (relatively) lower temperature (that is less than the temperature where thermal decomposition readily occurs), and an appreciable change in the thickness of the sacrificial layer is achieved (i.e., −72% at 172 nm).

TABLE 1

| UV Radiation Wavelength (nm) | Substrate holder temperature (degrees C.) | Thickness change after 15 minutes (%) |
| --- | --- | --- |
| None | 300 | −2 |
| 172 | 300 | −72 |
| 222 | 300 | −66 |
| 308 | 300 | −16 |
| 308 | 280 | −13 |

The via level dielectric layer 20 comprises a dielectric material that may have a dielectric constant value equal to or less than the dielectric constant of $SiO_2$, which is approximately 4 (e.g., the dielectric constant for thermal silicon dioxide can range from 3.8 to 3.9). In various embodiments of the invention, the via level dielectric layer 20 may have a dielectric constant of less than 3.0, a dielectric constant of less than 2.5, or a dielectric constant ranging from 1.6 to 2.7. The via level dielectric layer 20 may be described as a low dielectric constant (low-k) film or an ultra low-k film. The via level dielectric layer 20 may include a porous dielectric film, or it may include a non-porous dielectric film. For example, the via level dielectric layer 20 may include any one of the dielectric materials described above.

The metal lines 12 may comprise copper (Cu) or aluminum (Al) or aluminum-copper alloy, for example. Similarly, the metal vias 14 may comprise Cu or Al or aluminum-copper alloy, for example. The liner 16 may comprise tantalum (Ta), tantalum nitride ($TaN_x$), tantalum carbonitride ($TaC_xN_y$), Cu, ruthenium (Ru), or any material known to be used as a barrier layer or seed layer.

Optionally, following the formation of the cap layer 40, the cap layer 40 may be treated by a drying process in order to remove, or reduce to sufficient levels, one or more contaminants in the dielectric film, including, for example, moisture, solvent, porogen, or any other contaminant that may interfere with a curing process.

For example, a sufficient reduction of a specific contaminant present within the dielectric film, from prior to the drying process to following the drying process, can include a reduction of approximately 10% to approximately 100% of the specific contaminant. The level of contaminant reduction may be measured using Fourier transform infrared (FTIR) spectroscopy, or mass spectroscopy. Alternatively, for example, a sufficient reduction of a specific contaminant present within the dielectric film can range from approximately 50% to approximately 100%. Alternatively, for example, a sufficient reduction of a specific contaminant present within the dielectric film can range from approximately 80% to approximately 100%.

Figure 4B:
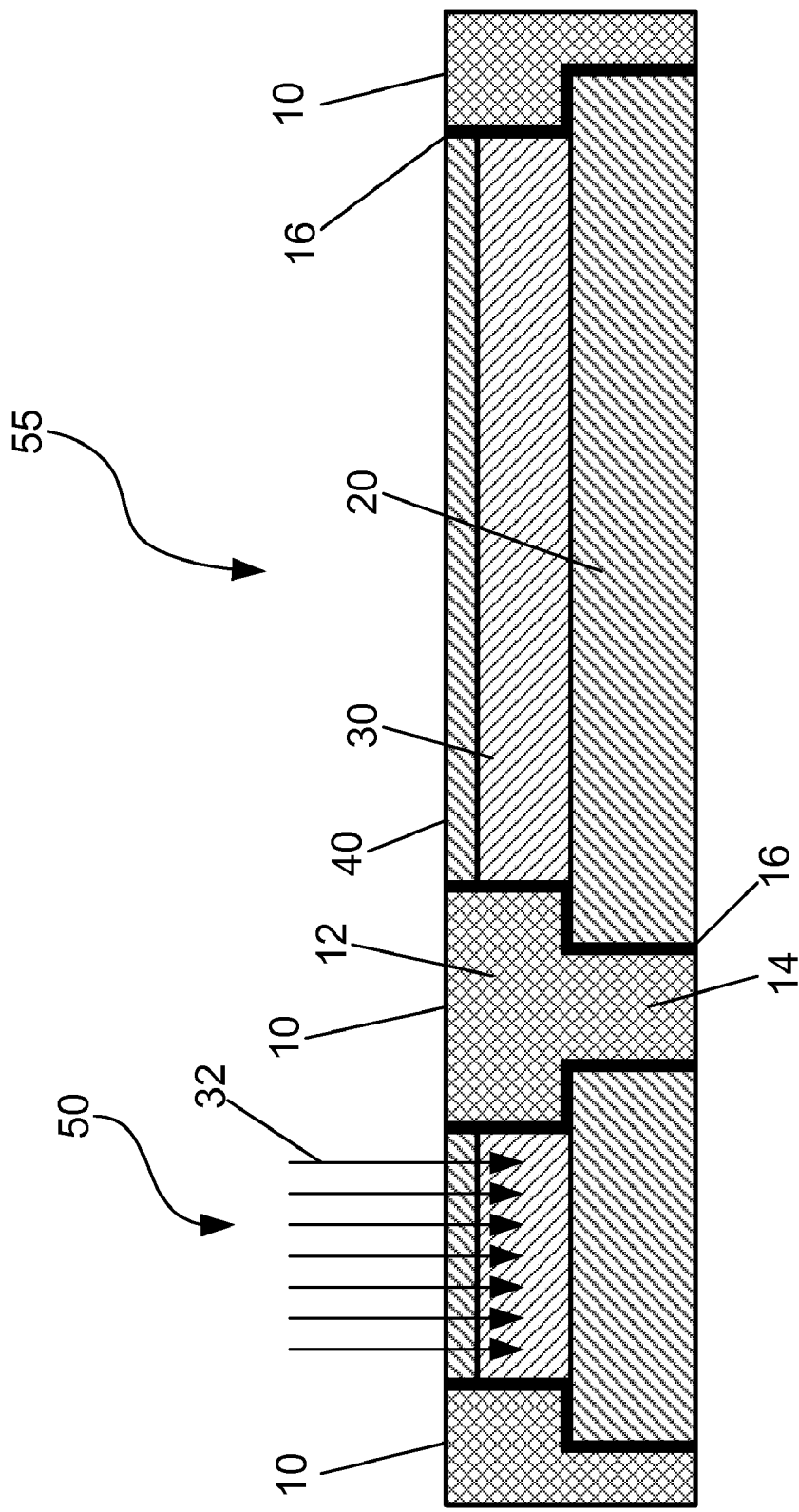

Referring now to FIG. 4B, the sacrificial layer 30 and the cap layer 40 are exposed to a first UV radiation process 32 in order to decompose the sacrificial layer 30 and cause the removal of the sacrificial layer 30 through the cap layer 40. The UV radiation 32 for the first exposure process is selected in order to decompose the sacrificial layer 30 and partially cure the cap layer 40. However, substantially no curing to minimal curing of the cap layer 40 is also acceptable. The inventors have observed that partial curing of the cap layer 40 during the first UV radiation exposure is acceptable, permitted that cross-linking in the cap layer is reduced or minimized. Excessive cross-linking of the cap layer during the first UV exposure can cause difficulty in removing the decomposed sacrificial material through the cap layer 40.

The inventors have recognized that the energy level (hv) and the rate that energy is delivered (q') to the cap layer 40 during decomposition of the sacrificial layer 30 vary at different stages of the curing process. The curing process can include mechanisms for generation of cross-link initiators, burn-out of porogens, decomposition of porogens, film cross-linking, and optionally cross-link initiator diffusion. Each mechanism may require a different energy level and rate at which energy is delivered to the dielectric film. For instance, during the curing of the matrix material, cross-link initiators may be generated using photon and phonon induced bond dissociation within the matrix material. Bond dissociation can require energy levels having a wavelength less than or equal to approximately 300 to 400 nm. Additionally, for instance, porogen burn-out may be facilitated with photon absorption by the photosensitizer. Porogen burn-out may require UV wavelengths, such as wavelengths less than or equal to approximately 300 to 400 nm. Further yet, for instance, cross-linking can be facilitated by thermal energy sufficient for bond formation and reorganization. Bond formation and reorganization may require energy levels having a wavelength of approximately 9 microns which, for example, corresponds to the main absorbance peak in siloxane-based organosilicate low-k materials.

The first exposure of the sacrificial layer 30 and the cap layer 40 to UV radiation may include exposing these layers to UV radiation from one or more UV lamps, one or more UV LEDs (light emitting diodes), or one or more UV lasers, or a combination of two or more thereof. The wavelength of the UV radiation may be less than or equal to approximately 350 nm. Desirably, the UV radiation may range in wavelength from approximately 150 nm to approximately 350 nm and, more desirably, the UV radiation may range in wavelength from approximately 170 nm to approximately 320 nm or from approximately 170 nm to approximately 240 nm).

During the first exposure of the sacrificial layer 30 and the cap layer 40 to UV radiation, these layers may be thermally treated by elevating the temperature of the substrate to a UV-assisted decomposition temperature less than the temperature required to thermally decompose the sacrificial layer 30 in the absence of UV radiation. The thermal decomposition temperature may be greater than or equal to 350 degrees C., or it may be greater than approximately 375 degrees C. Alternatively, the thermal decomposition temperature may be greater than or equal to approximately 400 degrees C., or it may be greater than approximately 425 degrees C. The UV-assisted decomposition temperature is selected to be less than the thermal decomposition temperature. For example, the UV-assisted decomposition temperature may be less than or equal to approximately 375 degrees C., or it may be less than or equal to approximately 350 degrees C. Alternatively, for example, the UV-assisted decomposition temperature may be less than or equal to approximately 325 degrees C., or it may be less than or equal to approximately 300 degrees C.

Optionally, during the first exposure of the sacrificial layer 30 to UV radiation, the sacrificial layer 30 and the cap layer 40 may be exposed to infrared (IR) radiation. The exposure of the sacrificial layer 30 and the cap layer 40 to IR radiation may include exposing these layers to IR radiation from one or more IR lamps, one or more IR LEDs, or one or more IR lasers, or a combination of two or more thereof. The IR radiation may range in wavelength from approximately 1 micron to approximately 25 microns. Desirably, the IR radiation may range in wavelength from approximately 8 microns to approximately 14 microns.

As illustrated in FIG. 4B, the sacrificial layer 30 may be selectively decomposed at specific regions on the substrate by selectively exposing the sacrificial layer at the specific regions on the substrate to UV radiation and heating the substrate to a UV-assisted decomposition temperature less than the thermal decomposition temperature of the sacrificial layer 30. For instance, in FIG. 4B, the sacrificial layer 30 is exposed to UV radiation and decomposed in the first region 50, while it is not exposed to UV radiation and decomposed in the second region 55. The method may further comprise selectively exposing the sacrificial layer 30 at the specific regions on the substrate to infrared (IR) radiation. Alternatively, the sacrificial layer 30 may be non-selectively decomposed on the substrate by non-selectively exposing the sacrificial layer on the substrate to UV radiation and heating the substrate to a UV-assisted decomposition temperature less than the thermal decomposition temperature of the sacrificial layer 30. Furthermore, the method may further comprise non-selectively exposing the sacrificial layer 30 on the substrate to infrared (IR) radiation.

When selectively exposing the sacrificial layer 30 to UV radiation, a UV exposure mask layer may be formed on the cap layer 40, wherein the UV exposure mask layer comprises an exposure pattern for decomposing the sacrificial layer 30. For example, the UV exposure mask layer may comprise a non-critical lithographic mask prepared using conventional lithographic procedures.

Figure 4C:
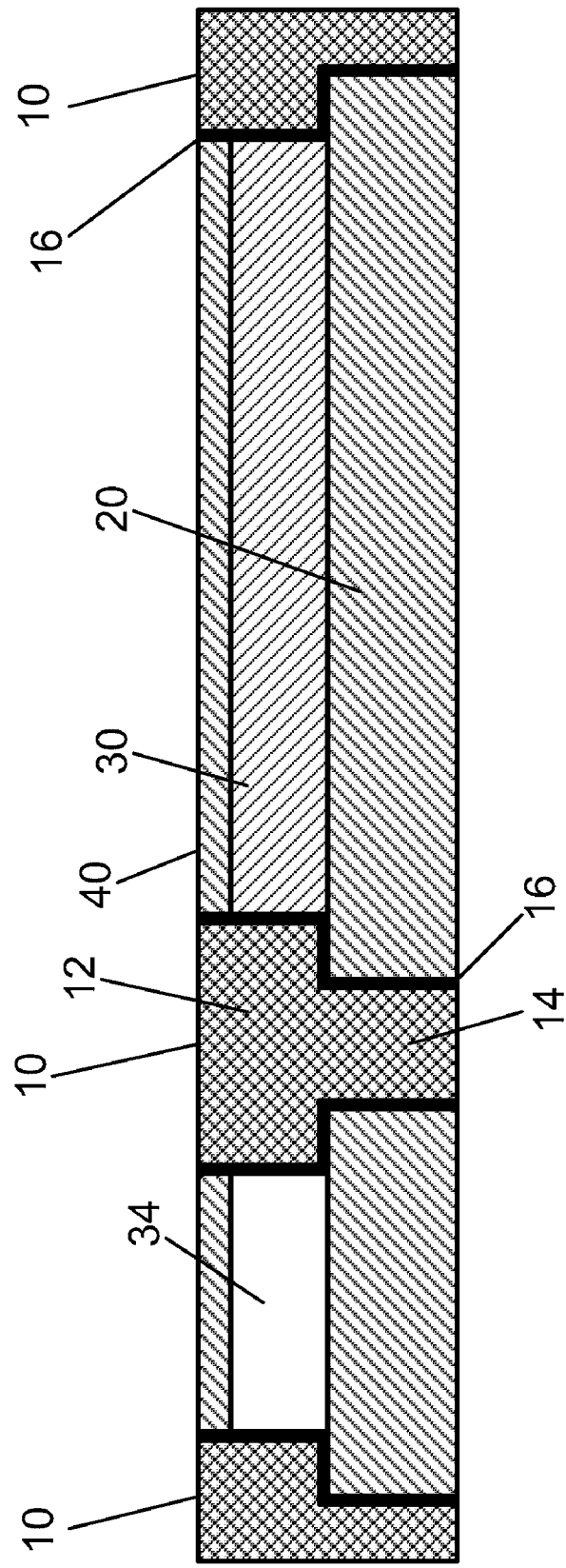

Referring now to FIG. 4C, the first UV radiation process facilitates the decomposition of the sacrificial layer 30. As the sacrificial layer 30 decomposes, the sacrificial layer 30 is removed through the cap layer 40, thus, leaving air gap 34.

Figure 4D:
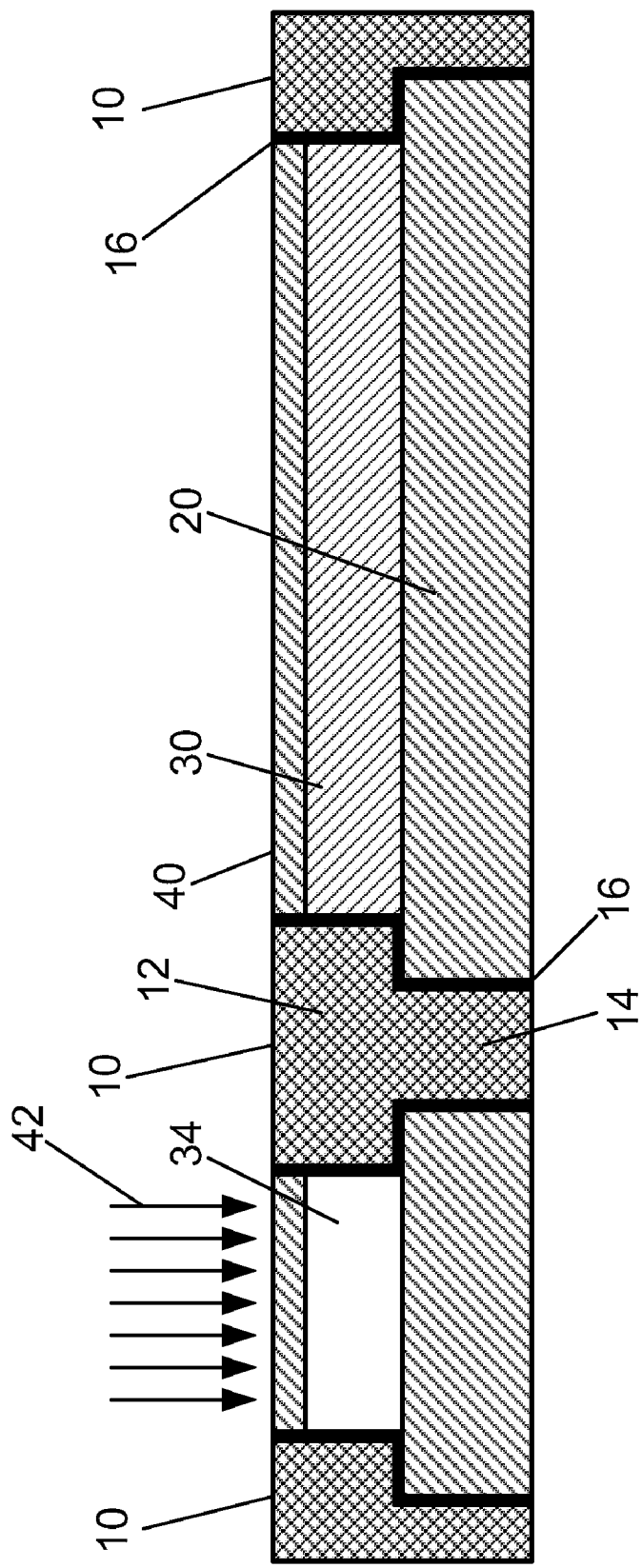
Figure 4E:
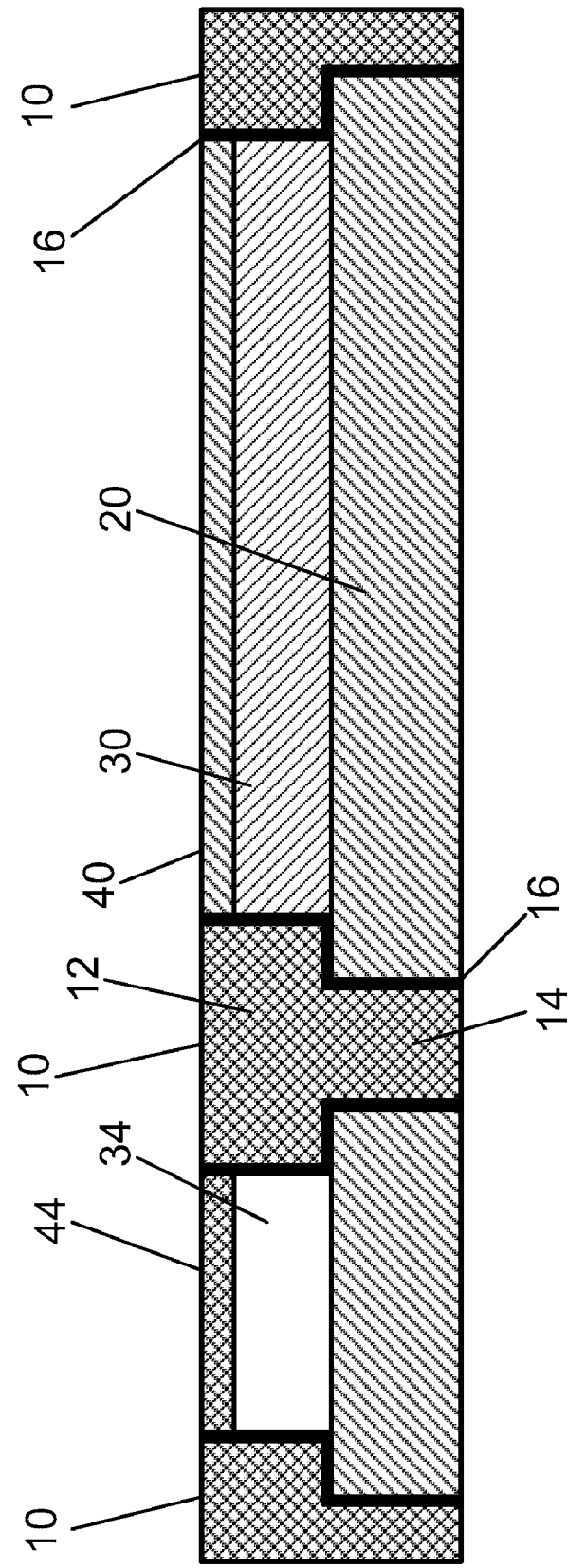

Referring now to FIG. 4D, the cap layer 40 is exposed to a second UV radiation process 42 in order to substantially remove decomposed sacrificial material trapped in the cap layer 40 and substantially complete the curing of the cap layer 40 to produce cured cap layer 44 (as shown in FIG. 4E). The curing of the cap layer 40 during the second UV radiation process may serve to mechanically strengthen the cap layer 40.

The second exposure of the cap layer 40 to UV radiation may include exposing the cap layer 40 to UV radiation from one or more UV lamps, one or more UV LEDs, or one or more UV lasers, or a combination of two or more thereof. The wavelength of the UV radiation may be less than or equal to approximately 350 nm. Desirably, the UV radiation may range in wavelength from approximately 100 nm to approximately 300 nm and, more desirably, the UV radiation may range in wavelength from approximately 150 nm to approximately 240 nm. According to one embodiment, the UV radiation for the second UV radiation process comprises wavelengths shorter than those during the first UV radiation process (e.g., higher energy to promote cross-linking of the cap layer 40).

During the second exposure of the cap layer 40 to UV radiation, the cap layer 40 may be thermally treated by elevating the temperature of the substrate to a UV-assisted cure temperature less than the temperature required to thermally decompose the sacrificial layer 30.

During the second UV radiation process, the cap layer 40 may also be exposed to IR radiation. The exposure of the cap layer 40 to IR radiation may include IR radiation from one or more IR lamps, one or more IR LEDs, or one or more IR lasers, or a combination of two or more thereof. The IR radiation may range in wavelength from approximately 1 micron to approximately 25 microns. Desirably, the IR radiation may range in wavelength from approximately 8 microns to approximately 14 microns.

Following the second UV radiation process, the cap layer 40 may optionally be thermally treated by elevating the temperature of the substrate to a thermal treatment temperature ranging from approximately 200 degrees C. to a temperature less than the thermal decomposition temperature of the sacrificial layer 30. If no sacrificial layer 30 exists on the substrate, higher thermal treatment temperatures may be permitted.

The thermal treatment of the dielectric film, following the first UV radiation process and the second UV radiation process, may be performed in the same processing system, as the UV exposure(s). Alternatively, the thermal treatment of the cap layer 40, following the first UV radiation process and the second UV radiation process, may be performed in a different processing system than the UV exposure(s).

Figure 5:
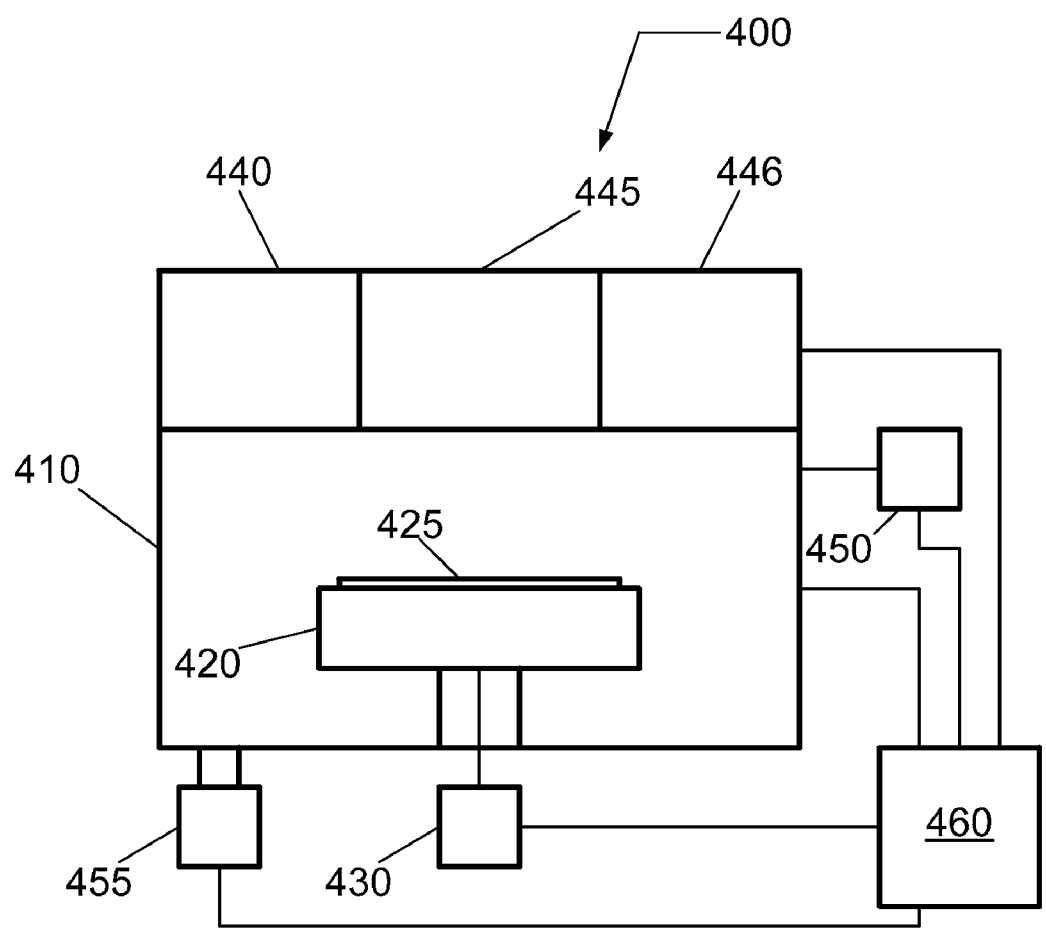
FIG. 5 is a schematic cross-sectional view of a processing system according to an embodiment.

Referring now to FIG. 5, a UV exposure system 400 is shown according to another embodiment. UV exposure system 400 includes a process chamber 410 configured to produce a clean, contaminant-free environment for treating a substrate 425 resting on substrate holder 420. UV exposure system 400 further includes one or more radiation sources configured to expose substrate 425 having the dielectric film to electro-magnetic (EM) radiation at single, multiple, narrow-band, or broadband EM wavelengths. The one or more radiation sources can include an optional IR radiation source 440 and a first UV radiation source 445. The exposure of the substrate to UV radiation and optionally IR radiation can be performed simultaneously, sequentially, or over-lapping one another. Additionally, the one or more radiation sources may include a second UV radiation source 446 configured to irradiate substrate 425 at a wavelength, or range of wavelengths, different than the first UV radiation source 445, or different than the first UV radiation source 445 and overlapping with the first UV radiation source 445.

The IR radiation source 440 may include a broad-band IR source, or may include a narrow-band IR source. The IR radiation source may include one or more IR lamps, one or more IR LEDs, or one or more IR lasers (continuous wave (CW), tunable, or pulsed), or any combination thereof. The IR power may range from approximately 0.1 mW to approximately 2000 W. The IR radiation wavelength may range from approximately 1 micron to approximately 25 microns and, desirably, can range from approximately 8 microns to approximately 14 microns. For example, the IR radiation source 440 may include an IR element, such as a ceramic element or silicon carbide element, having a spectral output ranging from approximately 1 micron to approximately 25 microns, or the IR radiation source 440 can include a semiconductor laser (diode), or ion, Ti:sapphire ($Al_2O_3$), or dye laser with optical parametric amplification.

The first UV radiation source 445 (and the second UV radiation source 446) may include a broad-band UV source, or may include a narrow-band UV source. The first and second UV radiation sources 445,446 may include one or more UV lamps, one or more UV LEDs, or one or more UV lasers (continuous wave (CW), tunable, or pulsed), or any combination thereof. UV radiation may be generated, for instance, from a microwave source, an arc discharge, a dielectric barrier discharge, or electron impact generation. The UV power density may range from approximately 0.1 $mW/cm^2$ to approximately 2000 $mW/cm^2$. The UV wavelength may range from approximately 100 nm to approximately 600 nm and, desirably, may range from approximately 200 nm to approximately 400 nm. For example, the first UV radiation source 445 (and the second UV radiation source 446) may include a direct current (DC) or pulsed lamp, such as a Deuterium ($D_2$) lamp, having a spectral output ranging from approximately 180 nm to approximately 500 nm, or the first UV radiation source 445 (and the second UV radiation source 446) may include a semiconductor laser (diode), (nitrogen) gas laser, frequency-tripled Nd:YAG laser, or copper vapor laser.

The IR radiation source 440, or the first and second UV radiation sources 445,446, or both, may include any number of optical devices to adjust one or more properties of the output radiation. For example, each source may further include optical filters, optical lenses, beam expanders, beam collimators, etc. Such optical manipulation devices as known to those skilled in the art of optics and EM wave propagation are suitable for the invention.

The substrate holder 420 can further include a temperature control system that can be configured to elevate and/or control the temperature of substrate 425. The temperature control system can be a part of a thermal treatment device 430. The substrate holder 420 can include one or more conductive heating elements embedded in substrate holder 420 coupled to a power source and a temperature controller. For example, each heating element can include a resistive heating element coupled to a power source configured to supply electrical power. The substrate holder 420 may optionally include one or more radiative heating elements. The temperature of substrate 425 can, for example, range from approximately 20 degrees C. to approximately 500 degrees C., and desirably, the temperature may range from approximately 200 degrees C. to approximately 400 degrees C.

A heating device may be utilized to elevate the temperature of substrate 425. The heating device may comprise the thermal treatment device 430 or the IR radiation source 440 or both.

Additionally, the substrate holder 420 may or may not be configured to clamp substrate 425. For instance, substrate holder 420 may be configured to mechanically or electrically clamp substrate 425.

Referring again to FIG. 5, UV exposure system 400 can further include a gas injection system 450 coupled to the process chamber 410 and configured to introduce a purge gas to process chamber 410. The purge gas can, for example, include an inert gas, such as a noble gas or nitrogen. Alternatively, the purge gas can include other gases, such as for example $H_2$, $NH_3$, $C_xH_y$, or any combination thereof. Additionally, UV exposure system 400 can further include a vacuum pumping system 455 coupled to process chamber 410 and configured to evacuate the process chamber 410. During a decomposition or curing process, substrate 425 can be subject to a purge gas environment with or without vacuum conditions.

Furthermore, UV exposure system 400 can include a controller 460 coupled to process chamber 410, substrate holder 420, thermal treatment device 430, optional IR radiation source 440, first and second UV radiation sources 445,446, gas injection system 450, and vacuum pumping system 455. Controller 460 includes a microprocessor, a memory, and a digital I/O port capable of generating control voltages sufficient to communicate and activate inputs to the UV exposure system 400 as well as monitor outputs from the UV exposure system 400. A program stored in the memory is utilized to interact with the UV exposure system 400 according to a stored process recipe. The controller 460 can be used to configure any number of processing elements (410, 420, 430, 440, 445, 446, 450, or 455), and the controller 460 can collect, provide, process, store, and display data from processing elements. The controller 460 can include a number of applications for controlling one or more of the processing elements. For example, controller 460 can include a graphic user interface (GUI) component (not shown) that can provide easy to use interfaces that enable a user to monitor and/or control one or more processing elements.

The controller 460 may be implemented as a DELL PRECISION WORKSTATION 610™. The controller 460 may also be implemented as a general purpose computer, processor, digital signal processor, etc., which causes a substrate processing apparatus to perform a portion or all of the processing steps of the invention in response to the controller 460 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 460 may be locally located relative to the UV exposure system 400, or may be remotely located relative to the UV exposure system 400 via an internet or intranet. Thus, the controller 460 can exchange data with the UV exposure system 400 using at least one of a direct connection, an intranet, and the internet. The controller 460 may be coupled to an intranet at a customer site (i.e., a device maker, etc.), or coupled to an intranet at a vendor site (i.e., an equipment manufacturer). Furthermore, another computer (i.e., controller, server, etc.) can access controller 460 to exchange data via at least one of a direct connection, an intranet, and the internet.

Furthermore, embodiments of this invention may be used as or to support a software program executed upon some form of processing core (such as a processor of a computer, e.g., controller 460) or otherwise implemented or realized upon or within a machine-readable medium. A machine-readable medium includes any mechanism for storing information in a form readable by a machine (e.g., a computer). For example, a machine-readable medium can include such as a read only memory (ROM); a random access memory (RAM); a magnetic disk storage media; an optical storage media; and a flash memory device, etc.

As described above with reference to FIGS. 4A through 4E, the first UV exposure process and the second UV exposure process may be performed in the same UV exposure system (such as UV exposure system 400 in FIG. 5). Alternatively, the first UV exposure process and the second UV exposure process may be performed in separate UV exposure systems (each of which may include components illustrated in FIG. 5). The UV exposure system may be coupled to a multi-element manufacturing system via a transfer system configured to transfer substrates into and out of the UV exposure system. For example, the multi-element manufacturing system can permit the transfer of substrates to and from processing elements including such devices as etch systems, deposition systems, coating systems, patterning systems, metrology systems, and other material processing systems.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for forming an air gap structure on a substrate, comprising:
   forming a sacrificial layer on a substrate, wherein said sacrificial layer comprises a decomposable material that thermally decomposes at a thermal decomposition temperature above approximately 350 degrees C.;
   forming a cap layer on said sacrificial layer at a substrate temperature less than said thermal decomposition temperature of said sacrificial layer;
   decomposing said sacrificial layer by performing a first exposure of said substrate to ultraviolet (UV) radiation and heating said substrate to a first temperature less than said thermal decomposition temperature of said sacrificial layer;
   removing said decomposed sacrificial layer through said cap layer; and
   then curing said cap layer to cross-link said cap layer by performing a second exposure of said substrate to UV radiation and heating said substrate to a second temperature greater than said first temperature.

2. The method of claim 1, wherein said first temperature causes substantially low photochemical reaction rates for said first UV exposure in said cap layer.

3. The method of claim 1, wherein said sacrificial layer thermally decomposes at a thermal decomposition temperature above approximately 375 degrees C.

4. The method of claim 1, wherein said sacrificial layer thermally decomposes at a thermal decomposition temperature above approximately 425 degrees C.

5. The method of claim 1, wherein said first temperature is less than approximately 350 degrees C.

6. The method of claim 1, wherein said first temperature is less than approximately 325 degrees C.

7. The method of claim 1, wherein said first temperature is less than approximately 300 degrees C.

8. The method of claim 1, wherein said first exposure of said substrate to UV radiation comprises exposing said substrate to UV radiation ranging from approximately 170 nanometers to approximately 320 nanometers.

9. The method of claim 1, wherein said second exposure of said substrate to UV radiation comprises exposing said substrate to UV radiation ranging from approximately 170 nanometers to approximately 240 nanometers.

10. The method of claim 1, wherein said first exposure of said substrate to UV radiation and said second exposure of said substrate to UV radiation are performed in the same processing chamber.

11. The method of claim 1, wherein said first exposure of said substrate to UV radiation comprises exposing said substrate to UV radiation at a first UV wavelength range, and said second exposure of said substrate to UV radiation comprises exposing said substrate to UV radiation at a second UV wavelength range.

12. The method of claim 1, wherein said first UV wavelength range is different than said second UV wavelength range.

13. The method of claim 1, wherein said sacrificial layer comprises P(npMA-co-EGDA), and wherein said cap layer comprises a porous material.

14. The method of claim 1, wherein said cap layer comprises a silicate-based material, and wherein said curing said cap layer does not occur prior to said decomposing and said removing said sacrificial layer in order to lessen resistance to removing said sacrificial layer through said cap layer.

15. The method of claim 14, wherein said forming said cap layer comprises depositing said cap layer on said substrate using a chemical vapor deposition (CVD) process.

16. The method of claim 1, wherein said sacrificial layer is exposed to infrared (IR) radiation during said decomposing said sacrificial layer.

17. The method of claim 1, wherein said cap layer is exposed to infrared (IR) radiation during said curing said cap layer.

* * * * *